United States Patent
Chou

(10) Patent No.: US 7,843,054 B2
(45) Date of Patent: Nov. 30, 2010

(54) CHIP PACKAGE AND MANUFACTURING METHOD THEREOF

(75) Inventor: Shih-Wen Chou, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 155 days.

(21) Appl. No.: 12/356,547

(22) Filed: Jan. 21, 2009

(65) Prior Publication Data

US 2010/0127367 A1 May 27, 2010

(30) Foreign Application Priority Data

Nov. 25, 2008 (TW) .............................. 97145557 A

(51) Int. Cl.
*H01L 23/24* (2006.01)
*H01L 23/48* (2006.01)
*H01L 23/52* (2006.01)

(52) U.S. Cl. ................ 257/687; 257/690; 257/E23.011; 438/118; 438/123

(58) Field of Classification Search ................ 257/687, 257/690, E23.011; 438/118, 123

See application file for complete search history.

(56) References Cited

U.S. PATENT DOCUMENTS

| | | | | |
|---|---|---|---|---|
| 2006/0223207 A1* | 10/2006 | Derderian et al. | ............. | 438/28 |
| 2007/0080435 A1* | 4/2007 | Lin | ............................ | 257/668 |
| 2009/0302485 A1* | 12/2009 | Fan | ............................ | 257/780 |
| 2010/0019373 A1* | 1/2010 | Fan | ............................ | 257/691 |
| 2010/0178501 A1* | 7/2010 | Masuko et al. | .......... | 428/355 N |

* cited by examiner

*Primary Examiner*—Ngan Ngo
(74) *Attorney, Agent, or Firm*—Jianq Chyun IP Office

(57) ABSTRACT

A chip package including a circuit substrate, a chip, a B-staged adhesive layer, a leadframe, a number of first bonding wires, a number of second bonding wires, and a number of third bonding wires. The chip is disposed on the circuit substrate. The B-staged adhesive layer is disposed on the circuit substrate. The leadframe is disposed on the circuit substrate and includes a number of leads. Portions of the leads are embedded in the B-staged adhesive layer, and an end of each of the leads is exposed by the B-staged adhesive layer. The first bonding wires are electrically connected between the chip and the circuit substrate. The second bonding wires are electrically connected between the chip and the leads. The third bonding wires are electrically connected between the leads and the circuit substrate. In addition, a manufacturing method of a chip package is also provided.

8 Claims, 4 Drawing Sheets

CHIP PACKAGE AND MANUFACTURING METHOD THEREOF

CROSS-REFERENCE TO RELATED APPLICATION

This application claims the priority benefit of Taiwan application serial no. 97145557, filed Nov. 25, 2008. The entirety of the above-mentioned patent application is hereby incorporated by reference herein and made a part of specification.

BACKGROUND OF THE INVENTION

1. Field of the Invention

The present invention relates to a semiconductor device and a manufacturing method thereof. More specifically, the invention relates to a chip package and a manufacturing method thereof.

2. Description of Related Art

The production of integrated circuit (IC) devices is mainly divided into three stages including IC design, IC fabrication and IC package.

During the IC fabrication, a chip is manufactured by performing steps of wafer fabrication, IC formation, wafer sawing, and so on. A wafer has an active surface, which generally refers to a surface equipped with active devices. After the IC inside the wafer is completely formed, a plurality of bonding pads are further disposed on the active surface of the wafer, such that a chip formed by sawing the wafer may be externally electrically connected to a carrier through the bonding pads. The carrier is, for example, a leadframe or a package substrate. In an alternative, the carrier is constituted by a leadframe and a package substrate. The chip can be connected to the carrier by wire bonding or by flip chip bonding, such that the bonding pads on the chip can be electrically connected to contacts of the carrier, thereby forming a chip package.

In general, tapes are used to adhere the leadframe onto a package substrate in the process of manufacturing the chip package. The tapes must be arranged on different regions of a surface of the package substrate in accordance with the shape of the leadframe, which is rather time-consuming and cost-ineffective. In addition, the costly tapes bring about an increase in manufacturing costs of the chip package.

SUMMARY OF THE INVENTION

The present invention is directed to a chip package having relatively low manufacturing costs.

The present invention is directed to a manufacturing method of a chip package. The manufacturing method is comparatively time-consuming.

In the present invention, a chip package including a circuit substrate, a chip, a B-staged adhesive layer, a leadframe, a plurality of first bonding wires, a plurality of second bonding wires, and a plurality of third bonding wires is provided. The chip is disposed on the circuit substrate. Besides, the B-staged adhesive layer is disposed on the circuit substrate. Additionally, the leadframe is disposed on the circuit substrate. Here, the leadframe includes a plurality of leads. Portions of the leads are embedded in the B-staged adhesive layer, and an end of each of the leads is exposed by the B-staged adhesive layer.

According to an embodiment of the present invention, the B-staged adhesive layer having a continuous annular pattern surrounds the chip and encapsulates portions of the leads.

According to an embodiment of the present invention, the B-staged adhesive layer has a plurality of non-continuous block patterns, and the B-staged adhesive layer having the non-continuous block patterns respectively encapsulates a portion of one of the leads.

According to an embodiment of the present invention, the leadframe is an lead-on-chip type leadframe. In another words, the leadframe does not have any die pad.

According to an embodiment of the present invention, the chip package further includes a molding compound disposed on the circuit substrate. The molding compound encapsulates the chip, the B-staged adhesive layer, the leadframe, the first bonding wires, the second bonding wires, and the third bonding wires.

In the present invention, a manufacturing method of a chip package is also provided. In the manufacturing method, first, a B-staged adhesive layer is formed on a circuit substrate, and a leadframe is adhered onto the circuit substrate through the B-staged adhesive layer. The leadframe includes a plurality of leads. Portions of the leads are embedded in the B-staged adhesive layer, and an end of each of the leads is exposed by the B-staged adhesive layer. A chip is then attached onto the circuit substrate. Next, a plurality of first bonding wires are formed, so as to electrically connect the chip and the circuit substrate; a plurality of second bonding wires are formed, so as to electrically connect the chip and the ends of the leads; and a plurality of third bonding wires are formed, so as to electrically connect the ends of the leads and the circuit substrate.

According to an embodiment of the present invention, a method of adhering the leadframe onto the circuit substrate through the B-staged adhesive layer includes first forming a two-stage adhesive layer on the circuit substrate. The two-stage adhesive layer is then B-stagized to form the B-staged adhesive layer. Next, the leadframe is pressed into the B-staged adhesive layer, and the B-staged adhesive layer is then completely cured.

According to an embodiment of the present invention, the manufacturing method of the chip package further includes forming a molding compound on the circuit substrate, such that the molding compound encapsulates the chip, the B-staged adhesive layer, the leadframe, the first bonding wires, the second bonding wires, and the third bonding wires.

In the present invention, the leadframe is adhered onto the circuit substrate through the B-staged adhesive layer. The formation of the B-staged adhesive layer is not time-consuming, and costs of fabricating the B-staged adhesive layer are relatively low. As such, the present invention is contributive to reduction of manufacturing time and costs.

In order to make the aforementioned and other features and advantages of the present invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
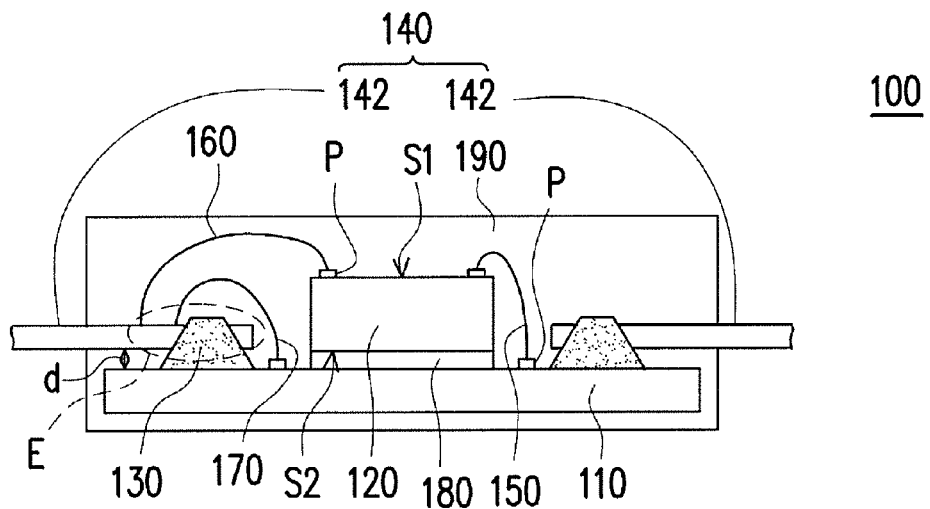
FIG. 1A is a schematic cross-sectional view illustrating a chip package according to an embodiment of the present invention.

FIG. 1A is a schematic cross-sectional view illustrating a chip package according to an embodiment of the present invention. Referring to FIG. 1A, the chip package 100 of the present embodiment includes a circuit substrate 110, a chip 120, and a B-staged adhesive layer 130. The chip 120 is disposed on the circuit substrate 110. The B-staged adhesive layer 130 is disposed on the circuit substrate 110. The leadframe 140 is disposed on the circuit substrate 110, wherein the leadframe 140 includes a plurality of leads 142. Portions of the leads 142 are embedded in the B-staged adhesive layer 130, and an end E of each lead 142 is exposed by the B-staged adhesive layer 130.

A distance d between the leads 142 and the circuit substrate 110 can be changed by adjusting the embedded degree of the leads 142 in the B-staged adhesive layer 130. According to the pertinent art, the substrate and the leads are adhered together with use of tapes. By contrast, a contact area between the leads 142 and the B-staged adhesive layer 130 is relatively large in the present invention, and thereby the bonding strength between the leads 142 and the circuit substrate 110 can be increased by using the B-staged adhesive layer 130 to encapsulate the leads 142.

Besides, in the conventional chip package, the height of the bonding wires is frequently reduced by the die pad having a down-set design, such that the molding compound located at one side of the leadframe having the bonding wires and at the other side of the leadframe having no bonding wires can have consistent height. As such, the conventional chip package can be prevented from being warped when the problem in connection with the inconsistent height of the molding compound located at respective sides of the leadframe is resolved. Note that the height difference between the die pad and the leads in the leadframe having the down-set die pad remains unchanged and is not likely to be modified. On the contrary, in the present embodiment, the leads 142 and the circuit substrate 110 has the distance d therebetween, and therefore the same effect generated in the down-set die pad can also be achieved in the present embodiment. Moreover, in comparison with the conventional down-set die pad, the distance d between the leads 142 and the circuit substrate 110 of the present embodiment can be adjusted by controlling the embedded degree of the leads 142 in the B-staged adhesive layer 130, thus contributing to more varieties in terms of design and arrangement.

Referring to FIG. 1A, in the present embodiment, the chip package 100 further includes a plurality of first bonding wires 150, a plurality of second bonding wires 160, and a plurality of third bonding wires 170. The first bonding wires 150 are electrically connected between the chip 120 and the circuit substrate 110. The second bonding wires 160 are electrically connected between the chip 120 and the ends E of the leads 142. The third bonding wires 170 are electrically connected between the ends E of the leads 142 and the circuit substrate 110.

To be more specific, the chip 120 has an active surface S1, a plurality of bonding pads P located on the active surface S1, and a back surface S2. The circuit substrate 110 also has a plurality of bonding pads P disposed thereon. The chip package 100 further includes a chip bonding layer 180 interposed between the back surface S2 of the chip 120 and the circuit substrate 110. The first bonding wires 150 are electrically connected between some of the bonding pads P of the chip 120 and some of the bonding pads P of the circuit substrate 110. The second bonding wires 160 are electrically connected between some of the bonding pads P of the chip 120 and the ends E of the leads 142.

Nonetheless, the electrical connecting manner of the chip package 100 is not limited in the present invention. That is to say, in addition to the above-mentioned electrical connecting manner, the chip package 100 of the present invention can be arranged in other ways to electrically connect various devices.

In the present embodiment, the leadframe 140 is not equipped with any die pad. The chip package 100 further includes a molding compound 190 disposed on the circuit substrate 110. Here, the molding compound 190 encapsulates the chip 120, the B-staged adhesive layer 130, the leadframe 140, the first bonding wires 150, the second bonding wires 160, and the third bonding wires 170.

Figure 1B:
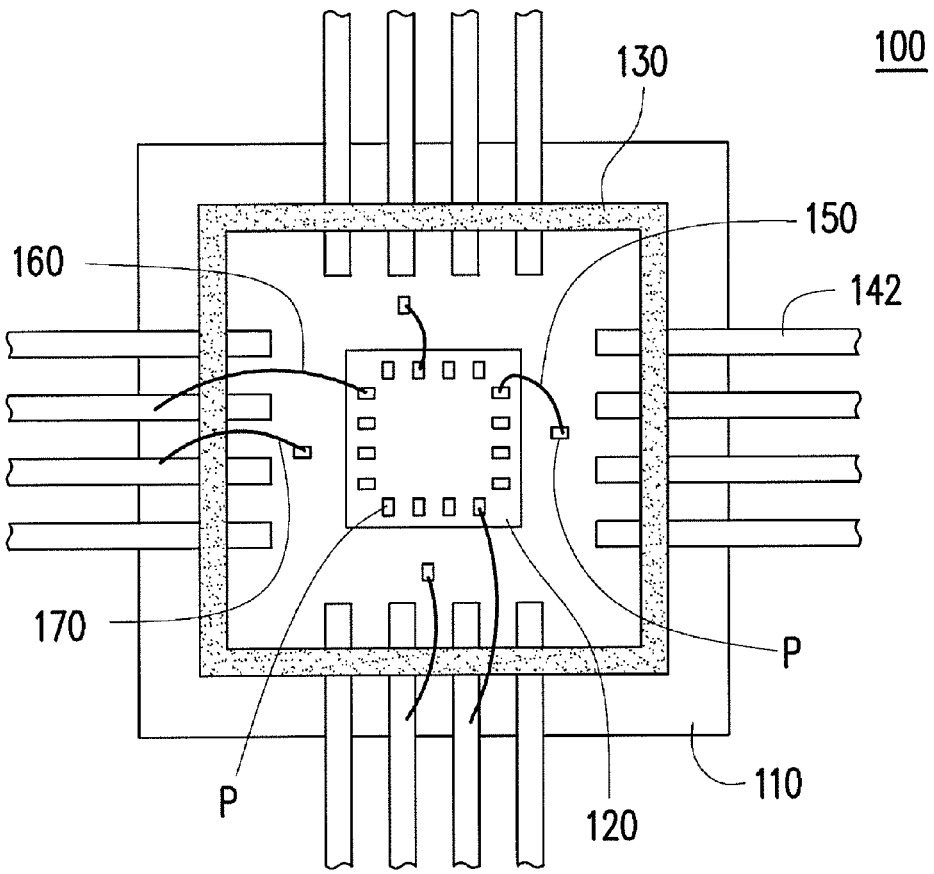
FIG. 1B is a schematic top view illustrating the chip package of FIG. 1A.

FIG. 1B is a schematic top view illustrating the chip package of FIG. 1A. Referring to FIG. 1B, the B-staged adhesive layer 130 of FIG. 1A having a continuous annular pattern surrounds the chip 120 and encapsulates portions of the leads 142.

In the present embodiment, the bonding pads P on the chip 120 can be electrically connected to one of the leads 142 simply through the second bonding wires 160. Note that the bonding pads P on the circuit substrate 110 can be electrically connected to one another through internal circuits (not shown) of the circuit substrate 110. Thereby, the bonding pads P on the chip 120 can be electrically connected to one of the leads 142 sequentially through the first bonding wires 150, one of the pads P on the circuit substrate 110, the internal circuits of the circuit substrate 110, another one of the bonding pads P on the circuit substrate 110, and the third bonding wires 170. In other words, since the arrangement of the bonding pads P on the chip 120 and the leads 142 remains unchanged and is unlikely to be modified, the bonding pads P on the chip 120 and the leads 142 disposed slightly away from the bonding pads P are apt to be electrically connected to one another through the internal circuits of the circuit substrate 110.

Figure 2:
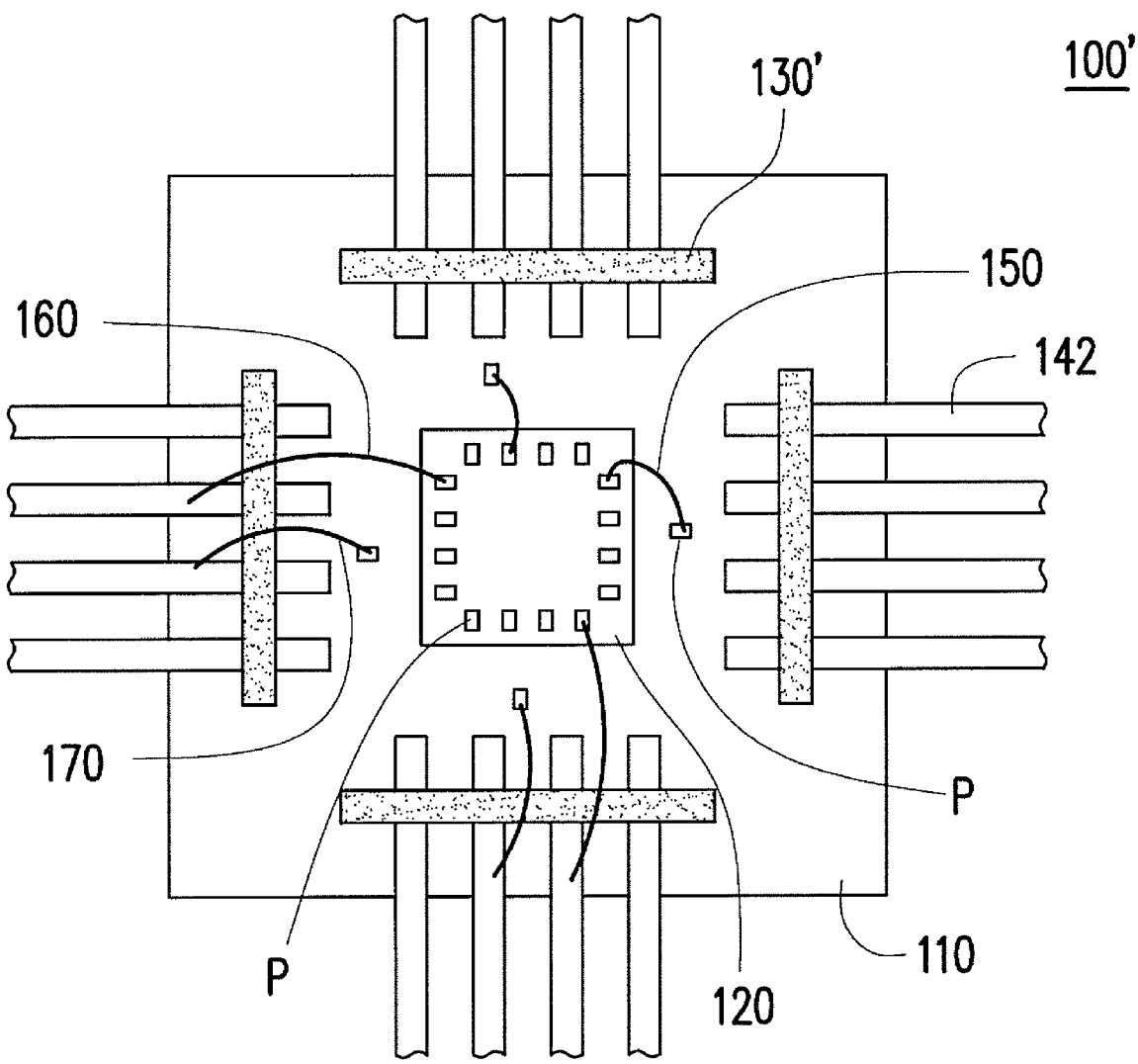
FIG. 2 is a schematic top view illustrating a chip package according to another embodiment of the present invention.

FIG. 2 is a schematic top view illustrating a chip package according to another embodiment of the present invention. Referring to FIG. 2, in comparison with the B-staged adhesive layer 130 of the chip package 100 depicted in FIG. 1B, a B-staged adhesive layer 130' of a chip package 100' in the present embodiment has a plurality of non-continuous block patterns. The B-staged adhesive layer 130' having the block patterns respectively encapsulates a portion of one of the leads 142 or portions of the leads 142.

Figure 3A:
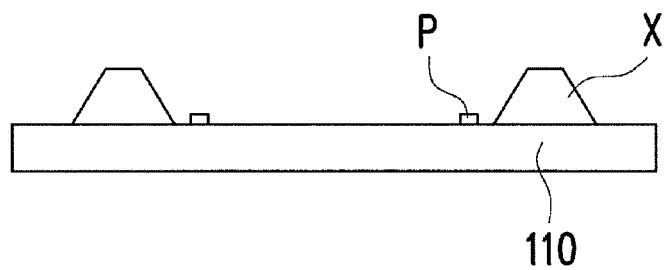
FIGS. 3A to 3E are schematic cross-sectional views illustrating a manufacturing method of the chip package depicted in FIG. 1A.
Figure 3B:
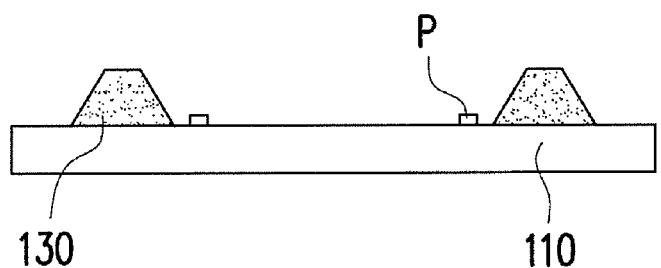

A manufacturing method of the chip package 100 depicted in FIG. 1A is elaborated hereinafter. FIGS. 3A to 3E are schematic cross-sectional views illustrating a manufacturing method of the chip package depicted in FIG. 1A. First, referring to FIG. 3A, a circuit substrate 110 having a plurality of bonding pads P is provided, and a two-stage adhesive layer X is formed on the circuit substrate 110. Next, as indicated in FIG. 3B, the two-stage adhesive layer X is B-stagized to form a B-staged adhesive layer 130.

Note that the two-stage adhesive layer X is made of a thermosetting adhesive material having two-stage properties (A-B stage and B-C stage), and therefore the B-staged adhesive layer 130 is formed after the two-stage adhesive layer X is B-stagized.

According to the present embodiment, the B-staged adhesive layer 130 can be model no. 8008, model no. 8008HT, model no. 6200, model no. 6201, and model no. 6202C supplied by ABLESTIK. In addition, the B-staged adhesive layer 130 can also be model no. SA-200-6, model no. SA-200-10 (both provided by HITACHI Chemical CO., Ltd.), or other similar B-staged adhesives, for example.

Figure 3C:
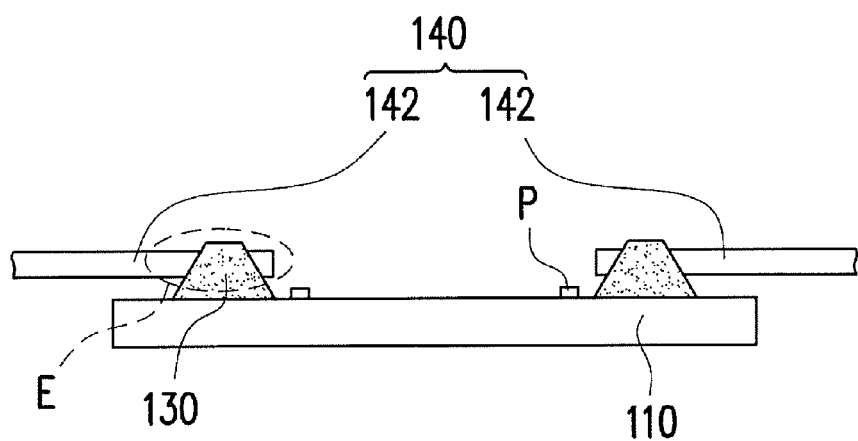

After that, referring to FIG. 3C, a leadframe 140 is provided. The leadframe 140 is pressed into the B-staged adhesive layer 130, and the B-staged adhesive layer 130 is further cured. The leadframe 140 includes a plurality of leads 142. Portions of the leads 142 are embedded in the B-staged adhesive layer 130, and an end E of each lead 142 is exposed by the B-staged adhesive layer 130.

Figure 3D:
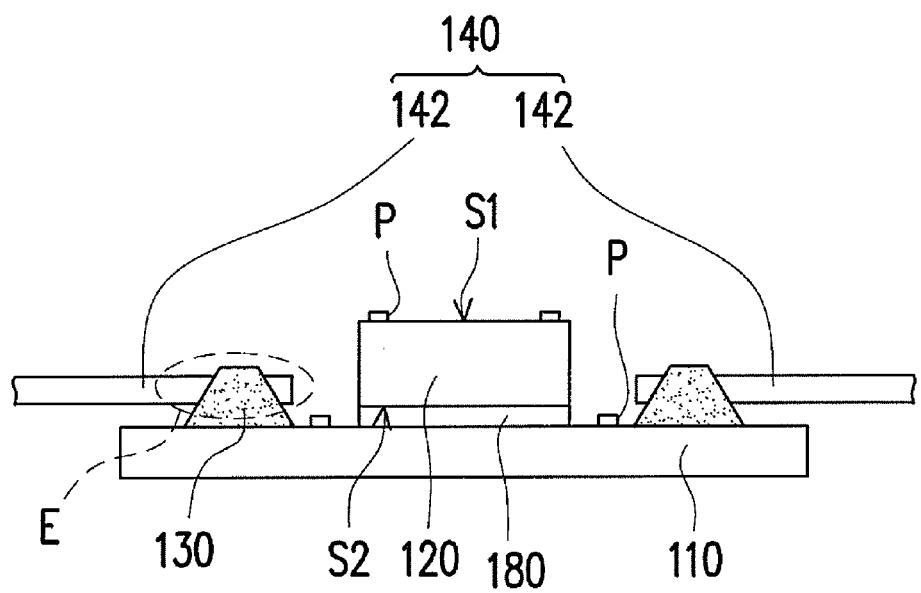

Thereafter, referring to FIG. 3D, a chip 120 having an active surface S1, a back surface S2, and a plurality of bonding pads P disposed on the active surface S1 is provided. A chip bonding layer 180 is then formed on the circuit substrate 110, and the back surface S2 of the chip 120 is adhered to the circuit substrate 110 through the chip bonding layer 180. In the present embodiment, the chip bonding layer 180 can be coated onto the back surface S2 of the chip 120, so as to bond the chip 120 to the circuit substrate 110.

Figure 3E:
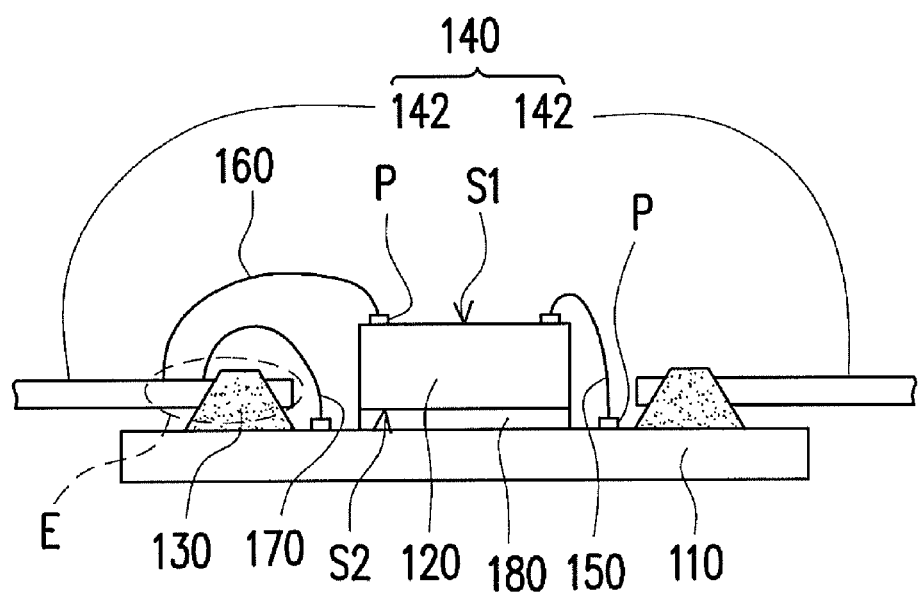

Next, referring to FIG. 3E, first bonding wires 150, second bonding wires 160, and third bonding wires 170 are formed. One of the bonding pads P on the active surface S1 of the chip 120 is electrically connected to one of the bonding pads P on the circuit substrate 110 through one of the first bonding wires 150. Another one of the bonding pads P on the active surface S1 of the chip 120 is electrically connected to an end E of one of the leads 142 through one of the second bonding wires 160. Besides, an end E of one of the leads 142 is electrically connected to another one of the bonding pads P on the circuit substrate 110 through one of the third bonding wires 170. In the present embodiment, the sequence of forming the first bonding wires 150, the second bonding wires 160, and the third bonding wires 170 is not restricted. Afterwards, referring to FIG. 1A, a molding compound 190 is formed on the circuit substrate 110 to encapsulate the chip 120, the B-staged adhesive layer 130, the leadframe 140, the first bonding wires 150, the second bonding wires 160, and the third bonding wires 170. Thereby, the chip package 100 is formed.

It should be mentioned that the number of the first bonding wires 150, the second bonding wires 160, and the third bonding wires 170 is determined upon the number of the bonding pads P on the chip 120 according to the present embodiment. The present invention does not pose a limitation to the number of the first bonding wires 150, the second bonding wires 160, and the third bonding wires 170.

To sum up, the leadframe of the present invention is adhered onto the circuit substrate through the B-staged adhesive layer, while the leadframe in the conventional chip package is attached onto the circuit substrate by using tapes. The disposition of the B-staged adhesive layer is not time-consuming. Moreover, costs of fabricating the B-staged adhesive layer are lower than the costs of tapes, and the thickness of the B-staged adhesive layer is less than that of the tapes. As such, the present invention is contributive to reduction of manufacturing time, manufacturing costs, and the entire thickness of the chip package. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
   a circuit substrate;
   a chip disposed on the substrate;
   a B-staged adhesive layer disposed on the circuit substrate;
   a leadframe disposed on the circuit substrate, wherein the leadframe comprises a plurality of leads, portions of the leads are embedded in the B-staged adhesive layer, and an end of each of the leads is exposed by the B-staged adhesive layer;
   a plurality of first bonding wires electrically connected between the chip and the circuit substrate;
   a plurality of second bonding wires electrically connected between the chip and the ends of the leads; and a plurality of third bonding wires electrically connected between the ends of the leads and the circuit substrate.

2. The chip package as claimed in claim 1, wherein the B-staged adhesive layer having a continuous annular pattern surrounds the chip and encapsulates portions of the leads.

3. The chip package as claimed in claim 1, wherein the B-staged adhesive layer has a plurality of non-continuous block patterns, and the B-staged adhesive layer having the non-continuous block patterns respectively encapsulates a portion of one of the leads.

4. The chip package as claimed in claim 1, wherein the leadframe is a lead-on-chip type leadframe.

5. The chip package as claimed in claim 1, further comprising a molding compound disposed on the circuit substrate, wherein the molding compound encapsulates the chip, the B-staged adhesive layer, the leadframe, the first bonding wires, the second bonding wires, and the third bonding wires.

6. A manufacturing method of a chip package, comprising:
   forming a B-staged adhesive layer on a circuit substrate and adhering a leadframe onto the circuit substrate through the B-staged adhesive layer, wherein the leadframe comprises a plurality of leads, portions of the leads are embedded into the B-staged adhesive layer, and an end of each of the leads is exposed by the B-staged adhesive layer;
   attaching a chip onto the circuit substrate;
   forming a plurality of first bonding wires electrically connected between the chip and the circuit substrate;
   forming a plurality of second bonding wires electrically connected between the chip and the ends of the leads; and
   forming a plurality of third bonding wires electrically connected between the ends of the leads and the circuit substrate.

7. The manufacturing method of the chip package as claimed in claim 6, wherein a method of adhering the leadframe onto the circuit substrate through the B-staged adhesive layer comprises:
   forming a two-stage adhesive layer on the circuit substrate;
   B-stagizing the two-stage adhesive layer to form the B-staged adhesive layer;
   pressing the leadframe into the B-staged adhesive layer; and
   completely curing the B-staged adhesive layer.

8. The manufacturing method of the chip package as claimed in claim 6, further comprising forming a molding compound on the circuit substrate, wherein the molding compound encapsulates the chip, the B-staged adhesive layer, the leadframe, the first bonding wires, the second bonding wires, and the third bonding wires.

* * * * *